United States Patent [19]

Jackson

[11] Patent Number: 4,518,913

[45] Date of Patent: May 21, 1985

[54] MEASURING PROBES

[75] Inventor: Rodney P. Jackson, Southport, England

[73] Assignee: H.E.M.E. International Limited, St. Helens, England

[21] Appl. No.: 379,344

[22] Filed: May 18, 1982

[30] Foreign Application Priority Data

May 22, 1981 [GB] United Kingdom ............... 8115877

[51] Int. Cl.³ .................. G01R 1/22; G01R 33/00; H01F 17/06

[52] U.S. Cl. ................... 324/127; 324/117 H; 336/176

[58] Field of Search ............ 324/127, 117 R, 117 H, 324/149, 129; 336/176

[56] References Cited

U.S. PATENT DOCUMENTS

| 1,924,039 | 8/1933 | Hockley | 324/127 |
| 2,663,845 | 12/1953 | Koch | 324/127 |
| 2,901,705 | 8/1959 | Lamb | 324/127 |
| 3,168,698 | 2/1965 | Goody et al. | 324/127 |

Primary Examiner—Ernest F. Karlsen
Attorney, Agent, or Firm—Banner, Birch, McKie & Beckett

[57] ABSTRACT

A "clip-on" probe for measuring electric currents by operation of the Hall effect comprises a ring of magnetizable material, at least part of which is mounted in a set of opposed jaws (4,5). The jaws are movable between an open position in which the jaws can be placed over a conductor and a closed position in which the jaws meet around the conductor and the ring is substantially complete. To facilitate removal of the probe when a heavy current is flowing through a conductor between the jaws, the jaws are provided with an opening mechanism with an actuator (7) so constructed and arranged that initial pressure on the actuator urges the jaws (4,5) apart from the closed position at a first mechanical advantage and, after an initial movement of the actuator, subsequent pressure urges the jaws towards the fully open position at a second lower mechanical advantage.

10 Claims, 4 Drawing Figures

MEASURING PROBES

The invention relates to a measuring probe, in particular, a measuring probe which, in use, forms a magnetic circuit around a conductor in order to obtain a signal related to the magnitude of the electric current flowing in the conductor, and to a measuring instrument having such a probe. Instruments having probes of this kind, which enable an electric current to be measured without interrupting or otherwise affecting the current flowing have been described previously and, for reasons which will become apparent, referred to as "clip-on" meters.

One type of clip-on ammeter is described in U.K. Patent Specification No. 1,525,310. This ammeter operates on the basis of the Hall effect (a well known electrical effect) and has a probe which, in use, forms a magnetic circuit around the current-carrying conductor and measures the voltage delivered by chips of material, which exhibit the Hall effect, mounted within the magnetic circuit. The magnetic circuit is produced in a ring of magnetisable material (viz steel) which concentrates the magnetic field resulting from the current to be measured. Magnetisable material forming the ring is mounted in a pair of opposed jaws which are relatively movable between an open position in which the jaws can be placed over the conductor and a closed position in which the jaws "clip-on" or surround the conductor.

When clip-on ammeters of the kind described above are used to measure a large direct current, substantial force is required to open the jaws so that the ammeter may be removed from the site of the measurement without switching the current off. The necessary force may be provided by equipping the jaws with long handles which enable substantial leverage to be applied to pull the jaws apart. However, this is an inelegant solution to the problem and results in an inconvenient increase in the bulk of the apparatus.

The present invention arises from the realisation, by the inventor, that, once the ring of magnetic material has been interrupted by an initial relative displacement of the jaws, the magnetic field in the magnetic circuit is substantially reduced and the force required to complete the opening of the jaws is similarly reduced.

According to the present invention, there is provided a measuring probe of the kind in which a complete or substantially complete ring of magnetisable material is formed around a conductor, the probe comprising a set of opposed jaws comprising magnetisable material and relatively movable between an open position in which the ring is broken and the jaws can be placed over a conductor and a closed position in which the jaws meet around the conductor and the ring of magnetisable material is at least substantially complete characterised in that the jaws are movable from the closed position to the open position by the action of an opening mechanism with an actuator so constructed and arranged that initial pressure on the actuator urges the jaws apart from the closed position at a first mechanical advantage and, after an initial movement of the actuator, subsequent pressure urges the jaws toward the fully open position at a second lower mechanical advantage.

The value of the first mechanical advantage is preferably selected to permit comfortable opening of the jaws by manual operation of the actuator when a current at the upper end of the range to be measured is flowing through a conductor between the jaws. The value of the second mechanical advantage may be selected to permit the desired opening of jaws, again with a pressure that can be applied to the actuator manually without undue effort, whilst allowing a desired compact construction. Generally, it is considered preferable for the ratio of said first mechanical advantage to said second mechanical advantage to be at least 3:1.

When the probe is in use, the magnetic field in the ring of magnetisable material is related to the current flowing in the conductor between the jaws, and the probe may therefore additionally comprise means for generating a signal related to the magnetic field in the ring (and hence the current flowing in the conductor). The said means for generating a signal may be, for example, a Hall generator (i.e. a chip of material which exhibits the Hall efect, for example, silicon or gallium arsenide) located in a gap in the ring of magnetisable material with electrical connectors for applying a potential difference across the Hall generator in a direction substantially perpendicular to the magnetic field. The Hall generator will generate a potential difference, related to the magnetic field, in a direction perpendicular to both the magnetic field and the applied potential difference and, by measuring the generated potential difference, a measure of the magnetic field, and hence the current flowing in the conductor between the jaws, may be obtained.

Thus, in a preferred form of the invention, the measuring probe comprises a Hall generator mounted in a gap in the ring of magnetisable material, first electrical connections for applying a potential difference across the Hall generator in a direction substantially perpendicular to the magnetic field from the ring and second electrical connections to the Hall generator along a line substantially perpendicular to the direction of said magnetic field and the direction of a potential difference applied between said first connections.

If it is desired to obtain a reading of the current flowing, the means for generating a signal may be arranged for connection to means for measuring the signal generated and means for displaying the resulting measurement.

Thus, according to a further aspect of the invention, there is provided a measuring instrument comprising a probe in accordance with the invention, means for generating a signal related to the magnetic field in the ring of magnetisable material in the probe, means for measuring the signal generated and means for displaying the resulting measurement.

The invention is illustrated but not limited by the following description, with reference to the accompanying drawings, of a preferred embodiment. In the drawings.

Figure 1:
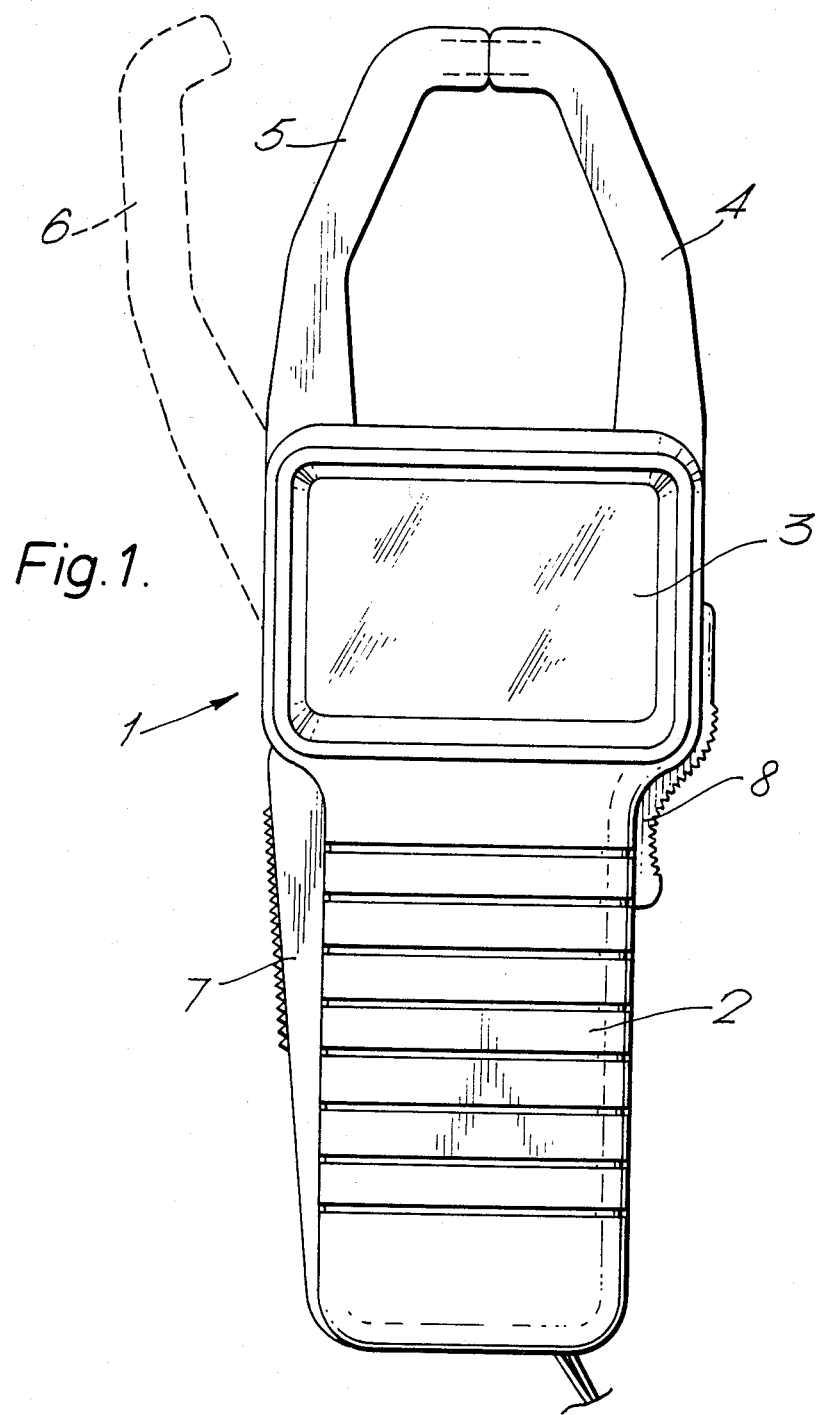
FIG. 1 is a plan view of a Hall effect clip-on ammeter with a probe in accordance with the invention and a digital display.

A Hall effect clip-on ammeter, generally designated 1, comprises a body portion 2 on which is mounted a digital display 3 for display of measurements made. A pair of jaws 4 and 5 are also mounted on body portion 2, the jaw 5 being movable between the closed position in which it is shown and an open position 6 indicated in dots. An actuator in the form of handle 7, for operating the mechanism which opens the jaws, and an on-off switch 8 are also mounted on body portion 2.

Figure 2:
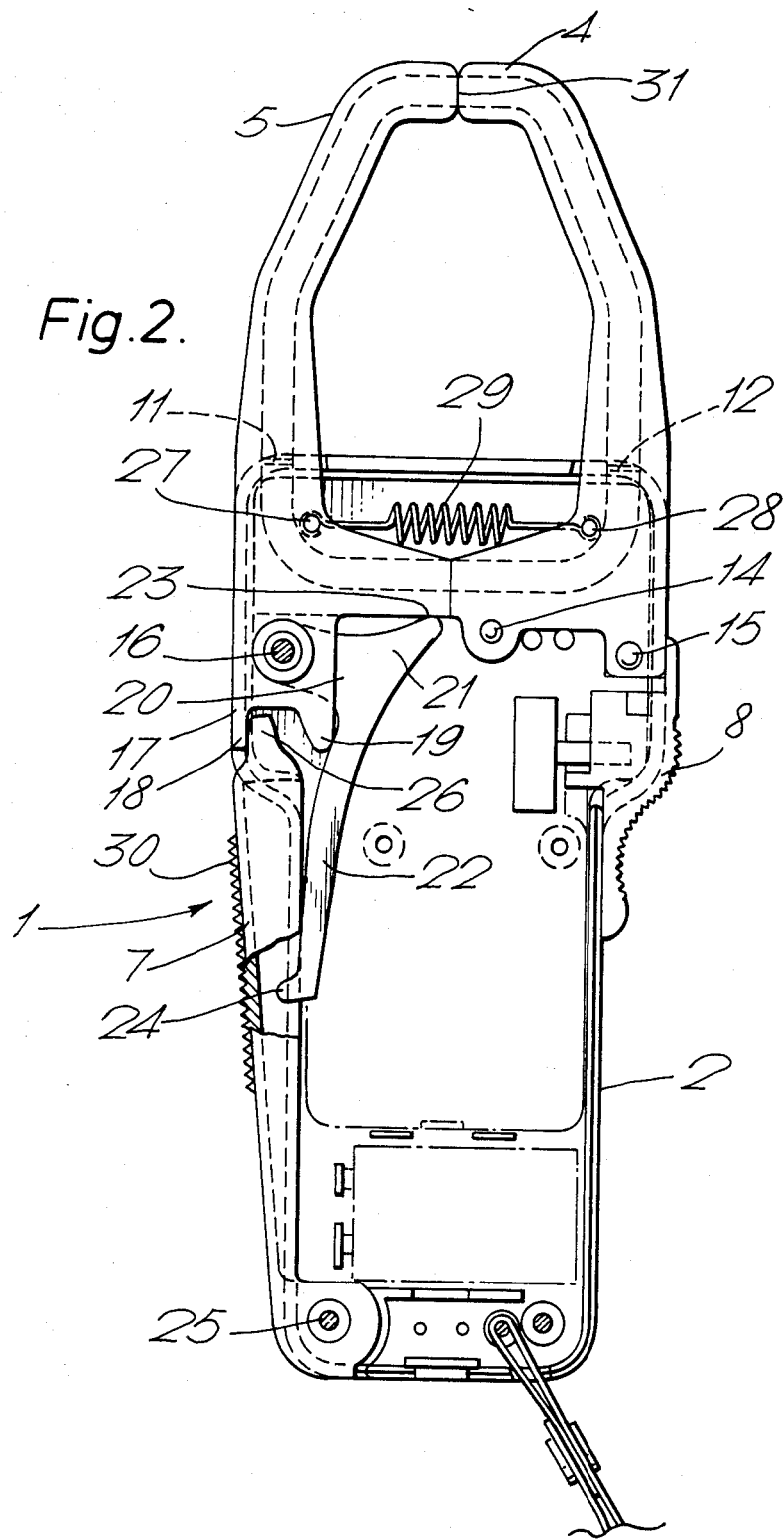
FIG. 2 is a plan view of the inside of the ammeter shown in FIG. 1 with the front cover removed.

In FIG. 2, a ring of magnetic material mounted in jaws 4 and 5, is indicated by dotted lines. There are gaps 11, 12 in the ring in which Hall generators are mounted and, if desired, other small gaps may be provided. However, air gaps in the magnetic circuit make it susceptible to the influence of stray fields and, to avoid inaccuracies due to stray fields, the ring of magnetisable material is substantially complete.

The jaw 4 is mounted in fixed position relative to the body portion 2 by rivets 14, 15. The jaw 5 is pivotally mounted relative to the body portion 2 and jaw 4 on pivot 16, and has a short limb 17, ending in a fork formed by prongs 18 and 19, extending beyond the pivot 16 in the direction of handle 7. A crank 20, also pivotally mounted on pivot 16 and rotatable within a slot formed in the short limb 17 of jaw 5, has a short limb 21 and a longer limb 22 extending approximately at right angles to each other. The short limb 21 bears on the lower edge of the jaw 5 at the point marked 23 whilst the longer limb 22 contacts the handle 7 at 24. The handle 7 is mounted on a pivot 25 at the base of the body portion 2 and the end 26 of the handle remote from the pivot 25 is located between prongs 18 and 19 forming the bifurcated end of the short limb 17 of the movable jaw 5. The jaw 5 is urged towards the fixed jaw 4 by a spring 29 mounted between the jaws and attached to them at 27 and 28 respectively.

To use the ammeter, the jaws are opened against the pressure of spring 29 by operation of the handle 7, placed around a conductor in which the current is to be measured and then allowed to close under the action of spring 29.

Figure 3:
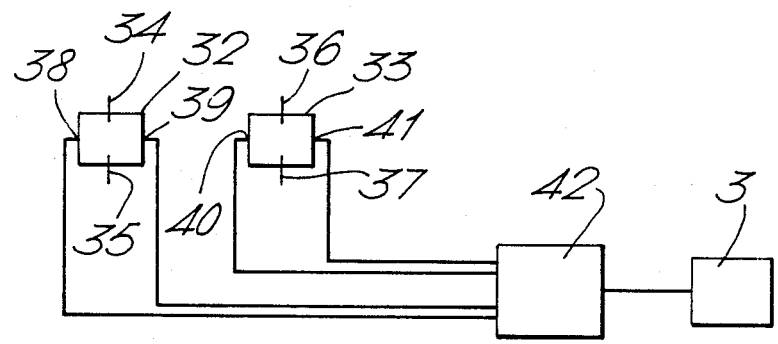
FIG. 3 is a schematic representation of the Hall generators and their connection to the display in the ammeter of FIGS. 1 and 2.

The ring of magnetic material concentrates the magnetic field resulting from the passage of the current through the conductor so that the Hall generators mounted at 11 and 12 are subjected to a magnetic field related to the magnitude of the current flowing in the conductor. The Hall generators 32, 33 and connections thereto are shown schematically in FIG. 3. A potential difference is applied across each of the Hall generators 32, 33, in a plane perpendicular to the direction of the magnetic field via electrical connections 34, 35 and 36, 37. The Hall generators each produce a potential difference at right angles to both the magnetic field and the applied potential difference. The potential differences generated by the Hall generators, which depend on the magnetic field and hence the current flowing in the conductor between the jaws, are applied via connections 38, 39 and 40, 41 to measuring circuitry 42. The measuring circuitry 42 processes the signals to produce a reading, on the digital display, of the magnitude of the current being measured.

To remove the ammeter from the conductor, the jaws must be opened. If a substantial current is flowing (e.g. 100 amps or more), there is a substantial magnetic field in the magnetic ring acting to retain the jaws in the closed position and, if the ammeter is to be removed without switching off the current, this force must be overcome.

An initial pressure on handle 7 towards the centre line of the ammeter is transferred by the crank 20 to the pivoted jaw 5 at 23. When this pressure is sufficient to overcome the force holding the jaws closed (which is largely the magnetic force resulting from the electric current flowing in the conductor), jaw 5 pivots anti-clockwise as shown in the drawing about pivot 16 and away from fixed jaw 4. As handle 7 and jaw 5 rotate the end 26 of the handle catches up with prong 19 and comes into contact with it. On further depression of the handle, beyond the initial movement which brings the end 26 of the handle into contact with prong 19, the prong 19 moves with the end 26 and the jaw 5 pivots at an increased angular rate so that the contact at 23 between jaw 5 and the short limb 21 of the crank 20 is broken.

If FIG. 2 is regarded as approximately to scale, it will be appreciated that point 24 lies approximately midway between pivots 16 and 25; thus an initial clockwise rotation of the handle 7 through a small angle X° will cause the crank 20 and hence the jaw 5 to rotate approximately X° anti-clockwise from the jaws closed position. As depression of the handle is continued, the end 26 of the handle comes into contact with prong 19 and the continued rotation of the jaw 5 depends on the displacement of prong 19 by the handle. The point of contact between prong 19 and handle 7 is approximately ⅞ of the distance between pivots 25 and 16 so that a further rotation of the handle clockwise through an angle X° will result in a corresponding anti-clockwise rotation of the jaw 5 through an angle of approximately 7X°.

Thus (disregarding any friction in the system), the ratio of the first mechanical advantage to the second mechanical advantage is approximately 7:1.

When there is no current, or only a small current, flowing through a conductor between the jaws 4, 5, a very light pressure on the handle 7 may, depending on the force exerted by spring 29, be sufficient to open the jaws. To avoid unintentional opening of the jaws by a light pressure on the handle, an additional spring member may be incorporated between the end 26 of the handle 7 and prong 19 of the short limb 17 of the movable jaw 5. Such a spring member may be mounted on the handle as illustrated in FIG. 4.

Figure 4:
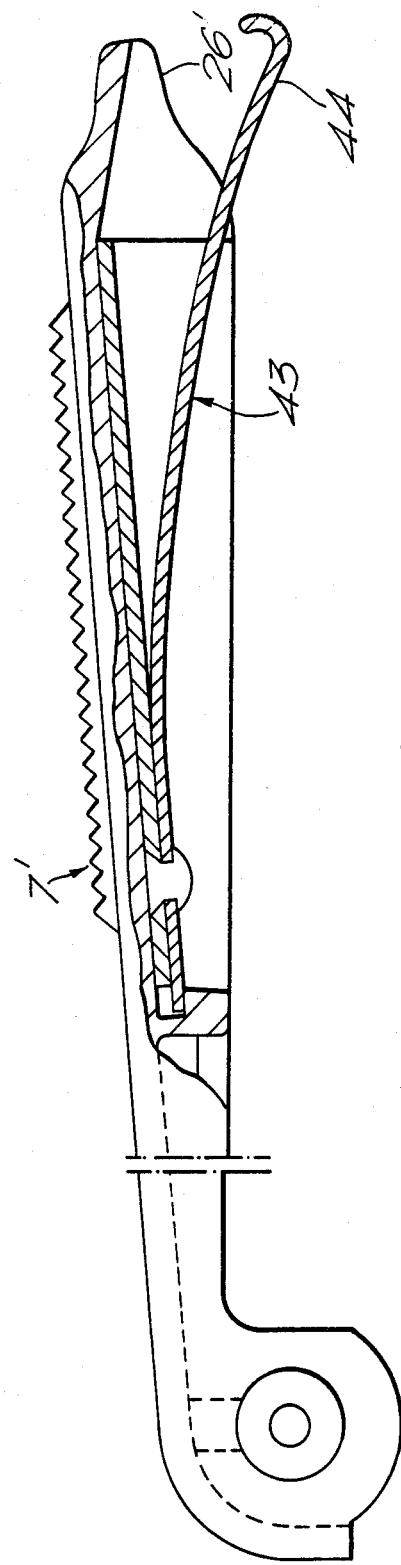
FIG. 4 is a plan view, partially cut away, of a modified form of the handle shown in FIG. 2.

The modified form of handle 7' illustrated in FIG. 4 incorporates a spring member 43 in the form of a shaped strip of spring steel riveted to the handle 7' at about its mid-point. When the modified form of handle 7' is used in place of handle 7 in the ammeter of FIGS. 1-3, the end 44 of spring bears against prong 19 and the spring member 43 exerts a pressure on the handle 7' to maintain it in a rest position with the jaws closed. When sufficient pressure is applied to handle 7' towards the centre line of the ammeter, the spring member 43 is deflected and the jaws open as a result of rotation of crank 20, which bears on jaw 5, about pivot 16. Spring member 43 becomes fully deflected before the end 26' of the handle 7' catches up with prong 19 and comes into contact with it. On further depression of the handle 7', prong 19 moves with the end 26' and the jaw 5 pivots at an increased angular rate so that contact at 23 between jaw 5 and the short limb 21 of the crank 20 is broken.

Although, in the embodiment described, the probe is constructed as an integral part of the ammeter, it will be appreciated that this is not essential and the probe may be constructed separately from the remaining parts of the meter and connected to them electrically.

Moreover, the probe is not necessarily associated with a meter. It may, for example, be used as part of a control system. In this case, the signal from the probe may be used as an input to the control system so that the system can respond in a desired manner to the magnitude of the current flowing in a conductor between the jaws of the probe.

I claim:

1. A measuring probe of the kind in which a substantially complete ring or magnetisable material is formed around a conductor, said probe comprising: a set of opposed jaws of magetisable material mounted to be relatively movable between an open position in which the ring is broken and the jaws can be placed over a conductor, and a closed position in which the jaws meet around the conductor and the ring of magnetisable material is at least substantially complete; an opening mechanism for said jaws with an actuator; means coupling said mechanism to at least one of said jaws to actuate said jaws to said open position, said mechanism including leverage means constructed such that initial pressure on said actuator urges said jaws apart from said closed position at a first mechanical advantage and, after initial movement of said actuator, subsequent pressure on said actuator urges said jaws toward said open position at a second lower mechanical advantage, the ratio of said first mechanical advantage to said second mechanical advantage being at least 3:1.

2. A measuring probe as claimed in claim 1 in which one of the jaws is pivotally mounted for movement between said closed position and said open position.

3. A measuring probe as claimed in claim 1 in which initial pressure on the actuator is transferred to the said one jaw via a pivotally mounted crank included in said leverage means.

4. A measuring probe as claimed in claim 1 in which one of the jaws is pivotally mounted for movement between a closed position and an open position and in which initial pressure on the actuator is transferred to the said jaw via a pivotally mounted crank included in said leverage means, the said jaw and crank being mounted to pivot on a common axis.

5. A measuring probe as claimed in claim 1 in which said actuator bears directly on said one jaw after initial movement of said actuator to urge said one jaw towards the fully open position at said second lower mechanical advantage.

6. A measuring probe as claimed in claim 5 in which one of said jaws is pivotally mounted for movement between a closed position and an open position.

7. A measuring probe as claimed in claim 5 in which one of said jaws is pivotally mounted for movement between a closed position and an open position, and in which initial pressure on the actuator is transferred to the said one jaw via a pivotally mounted crank.

8. A measuring probe as claimed in claim 1 which additionally comprises a Hall generator mounted in a gap in the ring of magnetisable material, first electrical connections for applying a potential difference across the Hall generator in a direction substantially perpendicular to the magnetic field from the ring, and second electrical connections to the Hall generator along a line substantially perpendicular to the direction of said magnetic field and the direction of a potential difference applied between said first connections.

9. A measuring instrument comprising a measuring probe as claimed in claim 1, means for generating a signal related to the magnetic field in the ring of magnetisable material in the probe, means for measuring the signal generated, and means for displaying the resulting measurement.

10. A measuring instrument comprising a measuring probe as claimed in claim 1 in which one of the jaws is pivotally mounted for movement between said closed position and said open position, and which further comprises means for generating a signal related to the magnetic field in the ring of magnetisable material in the probe, means for measuring the signal generated, and means for displaying the resulting measurements.

* * * * *